United States Patent
Ramdani et al.

[11] Patent Number: 5,835,521
[45] Date of Patent: *Nov. 10, 1998

[54] LONG WAVELENGTH LIGHT EMITTING VERTICAL CAVITY SURFACE EMITTING LASER AND METHOD OF FABRICATION

[75] Inventors: Jamal Ramdani, Gilbert; Michael S. Lebby, Apache Junction; Wenbin Jiang, Phoenix, all of Ariz.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 795,261

[22] Filed: Feb. 10, 1997

[51] Int. Cl.$^6$ ........................................... H01S 3/19
[52] U.S. Cl. ................................. 372/96; 372/50
[58] Field of Search ............................ 372/96, 45, 46, 372/43, 50

[56] References Cited

U.S. PATENT DOCUMENTS

| | | | |
|---|---|---|---|
| 5,314,838 | 5/1994 | Cho et al. | 437/105 |
| 5,363,398 | 11/1994 | Glass et al. | 372/45 |
| 5,373,520 | 12/1994 | Shoji et al. | 372/45 |
| 5,404,371 | 4/1995 | Otsubo et al. | 372/45 |
| 5,408,486 | 4/1995 | Shoji | 372/45 |
| 5,444,269 | 8/1995 | Adomi et al. | 372/45 |
| 5,459,746 | 10/1995 | Itaya et al. | 372/46 |
| 5,506,423 | 4/1996 | Saeki et al. | 372/44 |
| 5,533,041 | 7/1996 | Matsuda et al. | 372/46 |
| 5,557,627 | 9/1996 | Schneider, Jr. et al. | 372/45 |
| 5,583,351 | 12/1996 | Brown et al. | 257/89 |
| 5,600,158 | 2/1997 | Noto et al. | 372/45 |
| 5,625,637 | 4/1997 | Mori et al. | 372/96 |

Primary Examiner—Rodney Bovernick
Assistant Examiner—Ellen Kang
Attorney, Agent, or Firm—Eugene A. Parsons

[57] ABSTRACT

A longwavelength vertical cavity surface emitting laser (VCSEL) for use in optical telecommunications and method of fabrication that includes the fabrication of an active VCSEL structure on a supporting substrate and the fabrication of a highly reflective DBR mirror structure on a silicon substrate. The DBR mirror structure includes alternating layers of a silicon oxide material and a silicon material fabricated utilizing epitaxially growth techniques and/or wafer bonding using SOI wafer fusion technology. During fabrication of the final VCSEL device, the $Si/SiO_2$ DBR mirror structure is wafer bonded to the active VCSEL structure. The active VCSEL structure supporting substrate is selectively removed, to enable positioning of a second DBR mirror stack. The final VCSEL device characterized by emitting infra-red light.

18 Claims, 2 Drawing Sheets

LONG WAVELENGTH LIGHT EMITTING VERTICAL CAVITY SURFACE EMITTING LASER AND METHOD OF FABRICATION

FIELD OF THE INVENTION

The present invention pertains to semiconductor lasers, and, more particularly, to vertical cavity surface emitting lasers.

BACKGROUND OF THE INVENTION

At present, conventional edge emitting semiconductor lasers play a significant role in optical communication due to their high operating efficiency and modulation capabilities, however, edge emitting semiconductor lasers have several shortcomings or problems, thus making them difficult to use in many applications.

Recently, there has been an increased interest in vertical cavity surface emitting lasers (VCSELs). The conventional VCSEL has several advantages, such as emitting light perpendicular to the surface of the die, and the possibility of fabrication of two dimensional arrays. However, while conventional VCSELs have several advantages, they also have several disadvantages with regard to emission in the infrared spectrum longer than 1 μm primarily due to the poor reflectivity of the distributed Bragg reflectors which are contained as a part of the VCSEL structure. Because of this, manufacturability of VCSELs for the infra-red spectrum longer than 1 μm is severely limited.

Long wavelength (1.32 micrometers to 1.55 micrometers) vertical cavity surface emitting lasers (VCSELs) are of great interest in the optical telecommunications industry because of the minimum fiber dispersion at 1.32 micrometers and the minimum fiber loss at 1.55 micrometers. The dispersion shifted fiber will have both the minimum dispersion and the minimum loss at 1.55 micrometers. The long wavelength VCSEL is based on an $In_xGa_{1-x}As_yP_{1-y}$ active layer lattice matched to InP cladding layers. However, in this system, it is practically impossible to achieve a suitable monolithic DBR based mirror structure because of the insignificant difference in the refractive indices in this material system. As a result, many layers, or mirror pairs, are needed in order to achieve decent reflectivity.

Many attempts have been made to address this problem, including fabrication of devices that utilize wafer bonding techniques, yet only limited success has been shown. As an example, devices are currently utilized in which a DBR mirror structure is grown on a GaAs substrate. Next, the active layer is grown on the InP substrate. The two elements are then flipped mounted together and fused using wafer fusion techniques. The end result is a device that is expensive to manufacture, exhibits low efficiency, low output power and low yield. In addition, the interface defect density in the wafer fusion procedure causes potential reliability problems of the VCSEL end product.

Thus, there is a need for developing a reliable and cost effective infra-red vertical cavity surface emitting laser (VCSEL) for use in optical telecommunications technologies.

Accordingly, it is highly desirable to provide for an infra-red vertical cavity surface emitting laser (VCSEL) for use in optical telecommunications technologies that includes the fabrication of an InGaAsP/InP material based active region of a VCSEL structure on a silicon substrate, having included as a part thereof a DBR mirror structure composed of alternating layers of a silicon (Si) material and a silicon oxide ($SiO_2$) material, fused to the InGaAsP/InP active region using wafer fusion techniques, thereby allowing for a high degree of reflectivity.

It is a purpose of the present invention to provide a new and improved vertical cavity surface emitting laser (VCSEL) that utilizes a silicon substrate, and an InGaAsP/InP material based active region, thereby achieving a high degree of reflectivity.

It is a further purpose of the present invention to provide for a vertical cavity surface emitting laser that includes a silicon substrate having formed thereon alternating layers of silicon (Si) and silicon dioxide ($SiO_2$), as part of a highly reflective DBR mirror structure included within the VCSEL device.

It is a further purpose of the present invention to provide for a new and improved vertical cavity surface emitting laser (VCSEL) which will result in less defect density at the fused interface of the DBR mirror and the InGaAsP/InP active region.

It is a still further purpose of the present invention to provide for a new and improved vertical cavity surface emitting laser that is capable of emission in the infra-red spectrum.

SUMMARY OF THE INVENTION

The above problems and others are substantially solved and the above purposes and others are realized in a vertical cavity surface emitting laser including a silicon supporting substrate having a surface and including pairs of alternating layers. A first contact layer is disposed on the first distributed Bragg reflector. The first contact layer is further characterized as a bonding layer. A first cladding region is wafer fused to the first contact layer. An active region is disposed on the first cladding region. A second cladding region is disposed on the active region, and a second contact layer is disposed on the second cladding region. A dielectric mirror stack is disposed on the second contact layer.

In addition, disclosed is a method of fabricating a vertical cavity surface emitting laser including the steps of providing a first DBR mirror structure having positioned on an uppermost surface a bonding layer. Next, an active laser structure is fabricated including a supporting substrate, an etch stop layer, a buffer layer, a first cladding region, an active region and a second cladding region. Once completed, the supporting substrate, the etch stop layer, and the buffer layer are selectively removed from the active laser structure. To complete the VCSEL device structure, the first DBR mirror structure is mounted to the active laser structure using wafer bonding techniques, the bonding layer of the first DBR mirror structure being wafer bonded to the second cladding region of the active laser structure.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE PREFERRED EMBODIMENT

Figure 1:
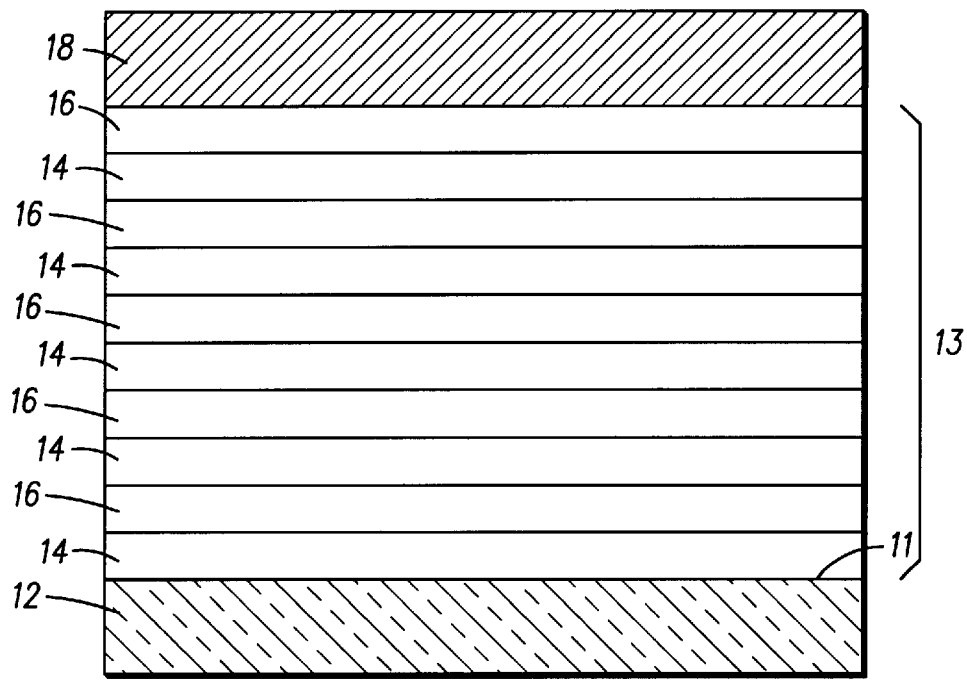
FIG. 1 is an enlarged simplified cross-sectional view of a Si/$SiO_2$ DBR mirror structure fabricated on a supporting substrate in accordance with the present invention.

During the course of this description, like numbers are used to identify like elements according to the different figures that illustrate the invention. Referring now to FIG. 1, illustrated is a simplified enlarged distributed Bragg reflector (DBR) mirror stack 10 according to the present invention. DBR mirror stack 10 is formed on a supporting substrate 12 having an upper surface 11. Supporting substrate 12 is formed of a silicon material. There are fabricated on surface 11 of substrate 12, a plurality of pairs of alternating layers 13 which compose distributed Bragg reflector mirror stack 10. More particularly, alternating layers 13 include within each pair, a layer of a silicon oxide ($SiO_2$) material 14 and a layer of a silicon (Si) material 16. It is disclosed that alternating layers 13 are fabricated utilizing standard epitaxial growth techniques, including chemical vapor deposition (CVD), plasma enhanced chemical vapor deposition (PECVD), sputtering, electron beam deposition (E-beam), and/or bond and etch back silicon on insulator (SOI) wafer fusion technology.

In a preferred embodiment, the plurality of pairs of alternating layers 13 are formed utilizing SOI technology whereby a first layer of the silicon oxide material 14 is wafer fused to silicon substrate 12. Thereafter, each of the layers of the silicon material 16 are wafer bonded to a previous layer of silicon oxide 14, using etch back SOI technology, more particularly utilizing implants to a desired depth and etching back to allow the next layer, thereby making a mirror pair or a pair of reflectors ($Si/SiO_2$). If additional mirror pairs are required, several more layers, i.e., additional mirror pairs, are deposited on the existing layers 14 and 16. A final layer of a single crystal silicon material 16 is fabricated as an uppermost layer of alternating layers 13. In an alternative fabrication technique, alternating layers 13 are fabricated utilizing epitaxial growth techniques in combination with SOI technology, whereby a layer of silicon material 16 is deposited on substrate 12. Next, a portion of layer 16 is oxidized to form layer 14 of the silicon oxide material. Alternatively, a layer of a silicon oxide material 14 is deposited on silicon substrate 12 and a layer of a silicon material 16 is deposited on the layer of silicon oxide. This process is repeated to form the plurality of pairs of alternating layers 13 of DBR mirror structure 10. The final layer of silicon material 16 is prepared utilizing silicon wafer bonding to the previous layer of silicon oxide material 14 using SOI technology. This allows for a high crystalline quality silicon layer to be formed as the uppermost layer of alternating layers 13, thereby permitting growth of a buffer layer 18 on an uppermost surface of the final layer of silicon material.

As previously stated, alternating layers 13 are fabricated in pairs. Generally, alternating layers 13 can have from four pair to seven pair of mirrors, with a preferred number of pairs ranging from five to six pairs. Additionally, applicant believes that five mirrored pairs of silicon and silicon oxide give an appropriate reflectivity performance for the complete VCSEL device operating in the infra-red spectrum. However, it should be understood that the number of alternating layers 13 can be adjusted for specific applications. Also, as previously stated, a top alternating layer is made of the high crystalline silicon material and forms a top layer for alternating layers 13. In order to achieve a high reflectivity, each repetitive layer in the distributed Bragg reflector 10 structure has to be exactly the same, i.e. one-quarter wavelength for each layer 14 and 16, to retain appropriate constructive interferences among those layers. In that the refractive index of silicon is approximately 3.5 and the refractive index of silicon oxide is approximately 1.5, there exist a large index difference between the two materials. Accordingly, fewer pairs of alternating layers 13 are required to achieve suitable reflectivity within DBR mirror structure 10.

There is positioned on uppermost layer 16 of silicon material, fabricated as a single crystal structure, a buffer layer 18 composed of a layer of n-doped gallium phosphide. Layer 18 will serve as the bonding layer with the active VCSEL structure (discussed presently) and as the n-contact in the completed device structure.

Figure 2:
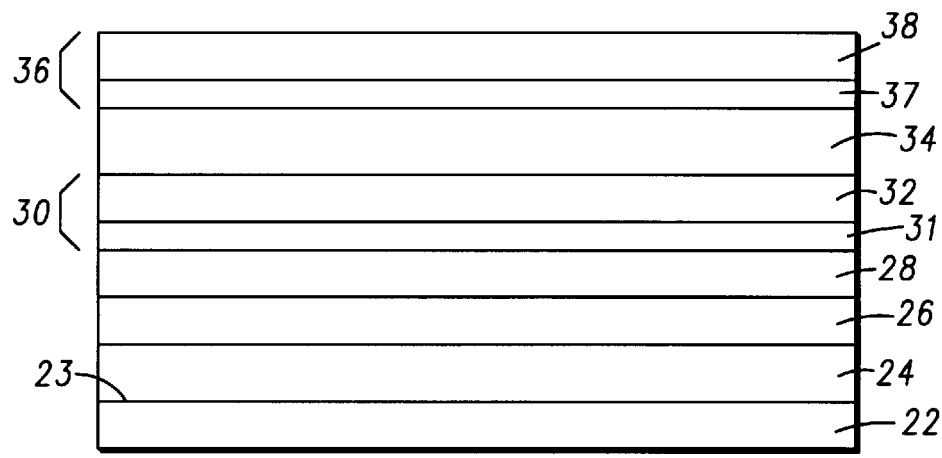
FIG. 2 is an enlarged simplified cross-sectional view of the active structure of the VCSEL device in accordance with the present invention.

Referring now to FIG. 2 illustrated is a simplified enlarged sectional view of an active structure of a vertical cavity surface emitting laser (VCSEL) 20 formed on a supporting substrate 22 having a surface 23. It should be understood that while FIG. 2 only illustrates a portion of a single VCSEL 20, VCSEL 20 may represent many VCSELs that are located on substrate 22 to form arrays. Generally, active VCSEL structure 20 is made of several defined areas or regions, such as an etch stop layer 24, a buffer layer 26, a second contact layer 28, a first cladding region 30, an active region 34 and a second cladding region 36.

Substrate 22, in this example, is made of an indium phosphide (InP) material, which will be selectively removed during fabrication of the complete longwavelength VCSEL device. In this particular example, supporting substrate 22 is utilized to grow the active portion of the VCSEL structure. In addition, there is provided etch stop layer 24, positioned adjacent substrate 22 and indium phosphide buffer layer 26 which will be selectively removed during fabrication of the complete device.

Typically, any suitable epitaxial deposition method, such as molecular beam epitaxy (MBE), metal organic chemical vapor deposition (MOCVD), or the like is used to deposit the required multiple layered structures, such as etch stop layer 24, buffer layer 26, second contact layer 28, second cladding region 36, active region 34 and first cladding region 30. Also, it should be understood that many of these layers are made of compound materials, such as n-doped indium phosphide, p-doped indium gallium arsenide phosphide, and indium gallium arsenide. It should be understood that epitaxial deposition is used extensively to produce the multitude of layers that comprise the active region of VCSEL 20.

Generally, thicknesses of second contact layer 28, first cladding region 30, second cladding region 36, and active region 34 are set out as portions of a wavelength of the light being emitted by the completed VCSEL device. It should be understood that the thickness and doping level of each layer must be precisely controlled. Any slight deviation to the designed parameters may affect the VCSEL performance, which will end up affecting the final manufacturing yield.

Doping of VCSEL 20 is achieved by the addition of dopant materials, e.g., n-type dopants and p-type dopants to epitaxial materials used for epitaxial deposition, thereby doping the epitaxially deposited material. Many different dopant concentrations, specific dopant materials, and placement of dopant materials can be used.

Once buffer layer 26 has been deposited on etch stop layer 24, a second contact layer 28, more particularly a layer including a highly p-doped indium gallium arsenide phosphide material, is epitaxially grown on buffer layer 26.

Contact layer 28 provides an P-metal contact for the completed VCSEL device and enhances the reliability of the VCSEL device by preventing the migration of dislocations and the like to active region 34.

Next, cladding region 30 is shown as being made of more than one layer epitaxially disposed or deposited on a previous layer (e.g. contact layer 28), with cladding region 30 being made of any suitable doped or undoped material layers such as a low p-doped indium gallium arsenide phosphide current spreading layer 31 and an indium phosphide cladding layer epitaxially deposited on contact layer 28. Active region 34 is represented by a single layer which is epitaxially deposited or disposed on cladding region 30; however, it should be understood that active region 34 can include one or more barrier layers and quantum wells, etc., more particularly a first barrier layer and a second barrier layer with a quantum well layer positioned between the first barrier layer and the second barrier layer. Active region 34 further includes an indium gallium arsenide phosphide material. Next, a cladding region 36 is epitaxially grown, or disposed, on active region 34. Cladding region 36 includes a low n-doped indium phosphide current spreading layer 37 and an n-doped indium phosphide cladding layer 38.

Figure 3:
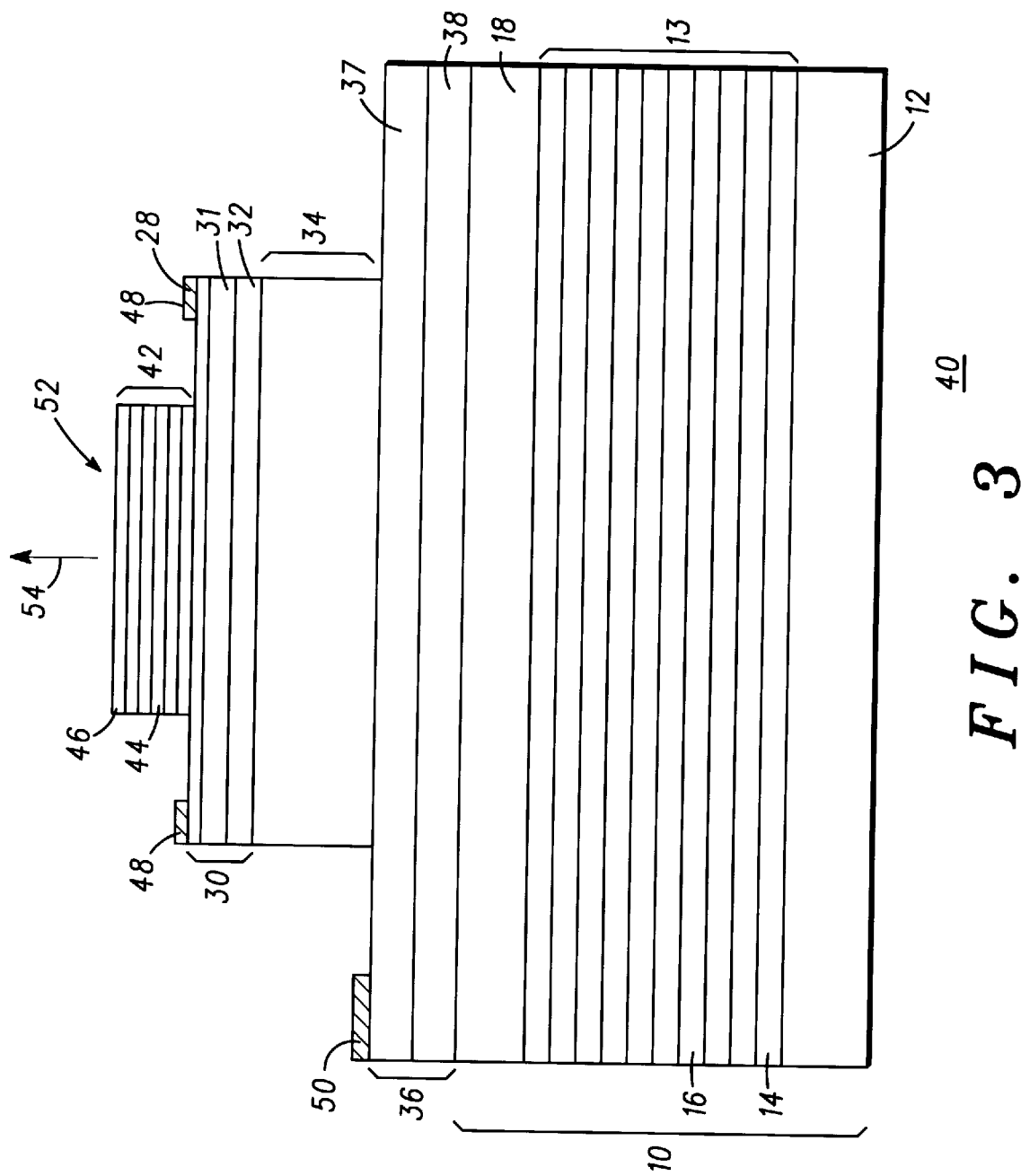
FIG. 3 is an enlarged simplified cross-sectional view of a complete long wavelength VCSEL device in accordance with the present invention.

Referring now to FIG. 3, illustrated in simplified cross-sectional view is a complete VCSEL device structure 40 fabricated according to the disclosed method. It will of course be understood that other methods might be utilized and the procedure to be described is simply for purposes of example and explanation. Components of the structure in FIG. 3 which are similar to components previously illustrated and described in conjunction with FIGS. 1 and 2 are designated with similar numbers.

During fabrication of device structure 40, DBR mirror structure 10, as illustrated in FIG. 1, is flip mounted and wafer fused to active structure 20, as illustrated in FIG. 2, utilizing temperatures in the range of 600°–650° C. for approximately 30 minutes in a $H_2$ atmosphere. More particularly, the n-doped gallium phosphide layer, the n-contact layer 18, of DBR mirror structure 10, characterized as a first contact layer, is wafer fused to an uppermost surface of cladding region 36 of the active VCSEL device structure 20. Next, supporting substrate 22, etch stop layer 24 and optionally buffer layer 26 are selectively removed from active VCSEL structure 20.

Next, second contact layer 28, cladding region 30, and active region 34 are etched to define VCSEL 40 but the diameter is still substantially larger than a laser emission aperture 52 and the operating cavity region, so that active region 34 will not be damaged by this etching step. Alternatively, proton implantation can be utilized for current isolation with the implantation mask slightly larger than the designed laser emission aperture 52.

A P-metal electrical contact 48 is formed on contact layer 28 by disposing any suitable conductive material on layer 28, such as indium tin oxide, gold, gold zinc, platinum gold, titanium tungsten, gold berryllium, or combinations thereof. A N-metal electrical contact 50 is formed in contact with contact layer 18 by disposing any suitable conductive material relative to layer 18, such as indium tin oxide, gold, gold germanium, nickel germanium gold, or combinations thereof. It should be understood that depending upon which material selection is made for electrical contacts 48 and 50, the specific method of disposing and patterning of that specific material will change to form first and second contact layers 18 and 28 and the electrical contact.

Once the above described etching or implantation step is completed P-metal contact 48 is deposited on contact layer 28, leaving laser emission aperture 52 open. Next, N-metal contact 50 is deposited relative to first contact layer 18, such as onto a surface of cladding region 36.

Finally a second distributed Bragg reflector 42, more specifically a dielectric mirror structure, is deposited onto contact layer 28. In this specific embodiment, VCSEL 40 is a top emitting laser so that second distributed Bragg reflector 42 is formed to define emitting window or aperture 52 therethrough which an infra-red laser emission 54 is emitted. It should be understood that many other types of electrical contacts may be utilized and the present structure is illustrated only for purposes of explanation.

Second distributed Bragg reflector 42 is made of a plurality of alternating layers. More particularly, second DBR 42 is fabricated as a dielectric mirror stack, including a plurality of alternating layers including one or more layers of a titanium oxide material 44, and one or more layers of silicon oxide material 46. By way of example, a layer of titanium oxide ($TiO_2$) is epitaxially deposited on contact layer 28, with a layer of silicon oxide ($SiO_2$) being subsequently epitaxially deposited on the layer of titanium oxide, thereby making another mirror pair or another pair of reflectors ($TiO_2/SiO_2$). If additional mirror pairs are required, several more layers, i.e., additional mirror pairs are deposited on the existing layers of titanium oxide and silicon oxide. Alternatively, second distributed Bragg reflector 42 is formed of a $Si/Al_2O_3$ material system or a $Si/SiO_2$ material system. It should be understood that second distributed Bragg reflector 42 serves as a dielectric mirror structure.

Generally, the plurality of alternating layers of second distributed Bragg reflector 42 are from one pair to ten mirror pairs, with a preferred number of mirror pairs ranging from four to five pairs. However, it should be understood that the number of mirror pairs can be adjusted for specific applications.

Accordingly, disclosed is an infra-red emitting vertical cavity surface emitting laser device and method of fabrication. The device of the present invention is fabricated as two separate wafer structures, which are thereafter wafer bonded one to the other utilizing SOI wafer bonding technology to form the longwavelength VCSEL device of the present invention. An active VCSEL structure is fabricated on an indium phosphide supporting substrate that provides for selective removal prior to wafer fusion with a $Si/SiO_2$ DBR mirror structure fabricated on a silicon supporting substrate. The $Si/SiO_2$ DBR mirror structure provides for a high percentage of reflectivity. The device as disclosed is designed to emit laser light in the infra-red range, having a decreased defect density at the interface of the two wafer structures, increased yield and decrease in manufacturing expense.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser comprising:

a silicon supporting substrate having a surface;

a first distributed Bragg reflector disposed on the silicon supporting substrate, the first distributed Bragg reflector including pairs of alternating layers and including a final layer of a high crystalline quality single crystal silicon (Si) material;

a first contact layer, disposed on the first distributed Bragg reflector;

a first cladding region wafer fused to the first contact layer;

an active region disposed on the first cladding region;

a second cladding region disposed on the active region;

a second contact layer disposed on the second cladding region; and a second distributed Bragg reflector disposed on the second contact layer, the second distributed Bragg reflector including pairs of alternating layers, the substrate, the first and second distributed Bragg reflectors, the first and second contact layers, the first and second cladding regions and the active region in combination defining an electrically pumped visible light emitting vertical cavity surface emitting laser.

2. A vertical cavity surface emitting laser as claimed in claim 1 where, in the pairs of alternating layers in the first distributed Bragg reflector, each pair of alternating layers includes a layer containing a silicon (Si) material.

3. A vertical cavity surface emitting laser as claimed in claim 2 where, in the pairs of alternating layers in the first distributed Bragg reflector, each pair of alternating layers includes a layer of a silicon oxide ($SiO_2$) material.

4. A vertical cavity surface emitting laser as claimed in claim 3 wherein the pairs of alternating layers in the first distributed Bragg reflector includes four to six pairs of alternating layers.

5. A vertical cavity surface emitting laser as claimed in claim 1 wherein the first contact layer includes a n-doped gallium phosphide (GaP) material.

6. A vertical cavity surface emitting laser as claimed in claim 1 wherein the first cladding region includes a n-doped cladding layer and a low n-doped current spreading layer.

7. A vertical cavity surface emitting laser as claimed in claim 6 wherein the low n-doped current spreading layer includes an indium phosphide (InP) material.

8. A vertical cavity surface emitting laser as claimed in claim 6 wherein the n-doped cladding layer includes an indium phosphide (InP) material.

9. A vertical cavity surface emitting laser as claimed in claim 1 wherein the active region includes an indium gallium arsenide phosphide (InGaAsP) material.

10. A vertical cavity surface emitting laser as claimed in claim 9 wherein the active region defines multiple quantum wells and a plurality of barrier layers.

11. A vertical cavity surface emitting laser as claimed in claim 1 wherein the second cladding region includes a p-doped cladding layer and a low p-doped current spreading layer.

12. A vertical cavity surface emitting laser as claimed in claim 11 wherein the p-doped cladding layer includes a indium phosphide (InP) material.

13. A vertical cavity surface emitting laser as claimed in claim 11 wherein the low p-doped current spreading layer includes a indium gallium arsenide phosphide (InGaAsP) material.

14. A vertical cavity surface emitting laser as claimed in claim 1 wherein the second contact layer includes a p-doped indium gallium arsenide phosphide (InGaAsP) material.

15. A vertical cavity surface emitting laser as claimed in claim 1 wherein the second distributed Bragg reflector includes a dielectric mirror structure, including pairs of alternating layers of a titanium oxide material and a silicon oxide material.

16. A vertical cavity surface emitting laser as claimed in claim 15 wherein the dielectric mirror structure includes pairs of alternating layers of a silicon material and a silicon oxide material.

17. A vertical cavity surface emitting laser comprising:

a silicon supporting substrate having a surface;

a first distributed Bragg reflector disposed on the surface of the supporting substrate, the first distributed Bragg reflector having pairs of alternating layers with a first layer in each pair including a silicon oxide (SiO2) material and a second layer in each pair including a silicon (Si) material, a final layer of the pairs of alternating layers including a high crystalline quality single crystal silicon (Si) material;

a first contact layer disposed on the first distributed Bragg reflector, the first contact layer including a n-doped gallium phosphide material;

a first cladding region, including a cladding layer and a current spreading layer, wafer fused to the first contact layer, the cladding layer including a n-doped indium phosphide (InP) material and the current spreading layer including a low n-doped indium phosphide (InP) material;

an active region disposed on the first cladding region, the active region including an indium gallium arsenide phosphide material;

a second cladding region, including a cladding layer and a current spreading layer, disposed on the active region, the cladding layer including a p-doped indium phosphide (InP) material and the current spreading layer including a low p-doped indium gallium arsenide phosphide (InGaAsP) material;

a second contact layer disposed on the second cladding region and including a p-doped indium gallium arsenide phosphide (InGaAsP) material; and a second distributed Bragg reflector disposed on the second contact layer, the second distributed Bragg reflector characterized by a dielectric mirror stack and including pairs of alternating layers.

18. A vertical cavity surface emitting laser as claimed in claim 17 wherein the active region is characterized by at least one quantum well layer, at least one first barrier layer and at least one second barrier layer with the at least one quantum well layer positioned between the at least one first barrier layer and the at least one second barrier layer.

* * * * *